United States Patent [19]

Hoffman

[11] Patent Number: 4,737,252
[45] Date of Patent: Apr. 12, 1988

[54] METHOD OF COATING A METALLIC ARTICLE OF MERCHANDISE WITH A PROTECTIVE TRANSPARENT FILM OF ABRASION-RESISTANCE MATERIAL

[75] Inventor: Richard A. Hoffman, Murrysville, Pa.

[73] Assignee: Westinghouse Electric Corp., Pittsburgh, Pa.

[21] Appl. No.: 612,491

[22] Filed: May 21, 1984

Related U.S. Application Data

[60] Division of Ser. No. 264,322, May 18, 1981, Pat. No. 4,517,217, which is a continuation-in-part of Ser. No. 185,655, Sep. 9, 1980, abandoned.

[51] Int. Cl.⁴ ............................................ C23C 14/40
[52] U.S. Cl. ............................. 204/192.16; 204/192.26
[58] Field of Search ......... 204/192 C, 192 SP, 192 D, 204/192.16, 192.26, 192.27, 192.28, 192.29

[56] References Cited

U.S. PATENT DOCUMENTS 3,687,713 8/1972 Adams .............................. 117/71 R
4,060,471 11/1977 Pinch et al. .................... 204/192 SP

FOREIGN PATENT DOCUMENTS 2554232  9/1976  Fed. Rep. of Germany ... 204/192 P
54-1620  1/1979  Japan .............................. 204/192 D
54-32183 3/1979  Japan ............................ 204/192.16
55-6425  1/1980  Japan ............................ 204/192.16
55-6426  1/1980  Japan ............................ 204/192.16

OTHER PUBLICATIONS

J. L. Vossen et al., *Thin Film Processes*, Academic Press, New York, 1978, pp. 164–167.

*Primary Examiner*—John F. Niebling
*Assistant Examiner*—William T. Leader
*Attorney, Agent, or Firm*—Daniel P. Cillo

[57] ABSTRACT

The surface of a metal article which is exposed to the atmosphere and abrasion during normal use of the article is protected from scratches and/or corrosion during such use by a thin transparent abrasion-resistant film of an inert non-metallic material such as $SiO_2$, SiC, $Si_3N_4$, $TiO_2$, MgO, $Al_2O_3$, $Ta_2O_5$, $Nb_2O_5$, $GeO_2$, spinel and selected colorless glass compositions. The protective film is preferably deposited by RF-sputtering techniques and undesirable coloration of the article by optical interference effects from incident light rays is avoided by properly correlating the film thickness with the refractive index of the particular material used to form the film. The invention permits the use of thinner gold plating on such items as articles of expensive jewelry and bracelets and cases for fine wristwatches without detracting from the quality, durability or appearance of the merchandise. Alternative embodiments in which several films of various selected non-metallic inert materials are combined to form composite protective coatings that provide additional cost and manufacturing advantages are also disclosed along with methods for sputter-depositing the protective films in the proper thicknesses to avoid optical discoloration effects, either on articles that have been previously plated with gold or which have been provided with a sputter-deposited layer of gold by sequentially operating the sputtering apparatus.

24 Claims, 2 Drawing Sheets

METHOD OF COATING A METALLIC ARTICLE OF MERCHANDISE WITH A PROTECTIVE TRANSPARENT FILM OF ABRASION-RESISTANCE MATERIAL

CROSS-REFERENCE TO RELATED APPLICATIONS

This is a division of application Ser. No. 264,322, filed May 18, 1981, now U.S. Pat. No. 4,517,217, which, in turn, is a continuation-in-part of application Ser. No. 185,655, filed Sept. 9, 1980, now abandoned.

BACKGROUND OF THE INVENTION

This invention generally relates to the art of protecting articles that have metallic surfaces which are susceptible to abrasion damage or corrosion and has particular reference to protecting gold-plated articles of jewelry and wristwatch components (such as bracelets and cases) with a transparent coating of one or more selected inert materials. The invention also provides methods for coating such articles with one or more overlying protective films that are transparent and composed of abrasion-resistant material.

As is well known, many articles of merchandise have metallic surfaces which inherently become dull or tarnished in the environment in which the article is used. For example, hardware items such as building-identification plaques, handrails, doorknobs, decorative doorknockers, etc. that are composed of brass or a similar metal oxidize quite rapidly and require constant polishing and waxing to maintain a brilliant pleasing appearance. This is also an age old problem with articles such as flatware, trays, trophies, etc. that are made of silver or are silver plated.

While articles such as fine jewelry and the like that are made from solid gold or have gold-plated surfaces do not tarnish and thus do not present such a maintenance problem, they scratch easily and soon become unsightly when subjected to the constant abrasion and "rubbing action" encountered during normal everyday use. Since gold is a relatively soft material, it also wears away quite rapidly when subjected to such conditions. If the article is gold-plated, this frequently exposes the base metal and creates an unsightly corroded appearance in the case of articles (such as chains, rings, lockets, watchbands, etc.) that are in direct contact with the person's body. These characteristics thus present serious problems in the production and marketing of such items as gold-plated jewelry and gold-plated bracelets and cases for wristwatches. In order to compensate for the loss of gold that occurs during use by the customer, relatively thick gold plating is customarily used on high quality merchandise of this type to ensure that the article will retain its original pleasing appearance. However, in view of the extremely high cost of gold and the likelihood that it will become even more expensive in the future, the use of such heavy gold plating presents a serious economic problem in the watch and jewelry industries.

A practical and reliable means for protecting gold and gold plated articles such as wristwatch components and the like from rapid wear and unsightly scratching (as well as corrosion if the gold plating has worn through) without materially changing its "natural" finish or appearance would, accordingly, not only be very desirable from a quality and marketing standpoint but would be very advantageous from a production and cost reduction standpoint. Such protective means would also be very useful in preventing skin reactions and similar problems that are sometimes encountered by certain individuals when they wear a ring, chain or similar article that is made from a particular metal or alloy.

SUMMARY OF THE INVENTION

All of the foregoing objectives are achieved in accordance with the present invention by coating the metallic surface of the article with a thin substantially transparent and colorless film of a selected inert and non-metallic material which tenaciously adheres to the surface and has sufficient "hardness" to provide a very durable and abrasion-resistant protective finish and covering. In accordance with a preferred embodiment, the protective film is composed of a dielectric type material such as silicon dioxide, magnesium oxide, aluminum oxide, titanium dioxide, spinel, silicon nitride, silicon carbide and various types of glasses that have the proper combination of hardness, transparency and thermal expansion characteristics. Other dielectric type materials which are substantially transparent in film thicknesses and are also suitable are tantalum oxide, niobium oxide, and germanium oxide. Certain types of glasses can also be used as the protective covering or as "buffer" layers between the protective films and the substrates to compensate for differences in the thermal expansion characteristics of the substrate material and protective material.

The protective film of selected inert material is preferably deposited by RF-sputtering techniques and its thickness is controlled to prevent undesirable discoloration of the article by optical interference effects produced by incident light rays which enter the film. Such interference effects are exhibited by transparent films when the optical thickness (that is, the true thickness of the film multiplied by the refractive index of the film material) is comparable to the wavelength of light and thus falls within the range of from about 3,000 to 8,000 Angstroms (the visible portion of the spectrum). Since the refractive index for the various film materials is different, the optimum thickness range will also vary depending upon the particular material used to form the protective film.

Composite type films which include one or more additional layers of another material are also employed in accordance with another embodiment of the invention to enhance the adhesion of the protective film as well as the adhesion of a layer of a different metal that is sputtered onto the substrate (as in the case of an article of base metal such as a watchband that is first coated with a sputtered layer of gold or another precious metal). A composite coating consisting of very thin films of a precious metal (such as gold) and interposed alternately-arranged transparent films of a protective material are employed in accordance with another embodiment to further reduce the amount of precious metal required per article. Various methods of forming the protective films and also sequentially metal-coating and then protectively-coating various articles composed of a base metal employing sputtering-deposition apparatus and techniques are also disclosed.

BRIEF DESCRIPTION OF THE DRAWING

A better understanding of the invention will be obtained from the exemplary embodiments shown in the accompanying drawing, wherein.

DESCRIPTION OF THE PREFERRED EMBODIMENTS

While the present invention can be used with advantage to protectively coat various kinds of articles having metallic surfaces that are subject to attack or corrosion by the environment in which they are used as well as pieces of jewelry and the like that are plated with a layer of a precious metal of a type which is easily scratched or rapidly worn away during normal use of the jewelry, it is especially adapted for use in conjunction with gold-plated articles such as bracelets and cases for wristwatches and the like and it has accordingly been so illustrated and will be so described.

Figure 1:
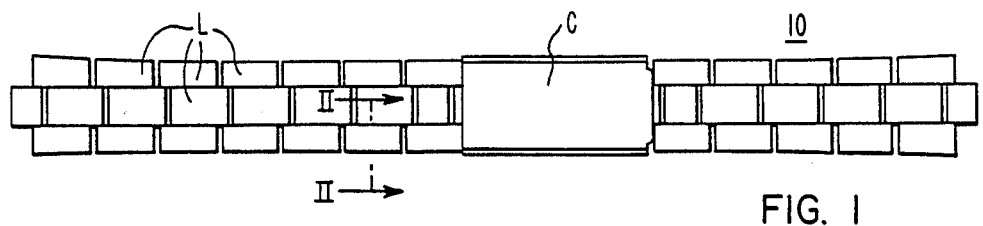
FIG. 1 is a plan view of a gold-plated band or bracelet for a wristwatch which has been protectively coated in accordance with the invention.
Figure 2:
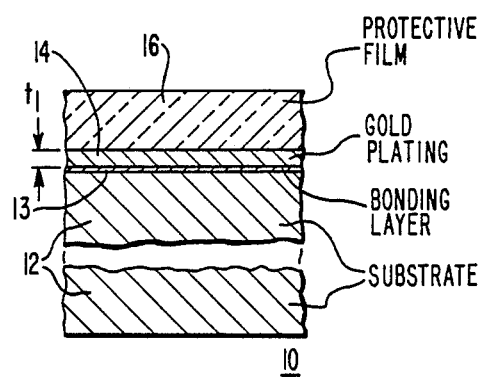
FIG. 2 is a fragmentary cross-sectional view, on a greatly enlarged scale, through a portion of the watch bracelet shown in FIG. 1 and depicts the manner in which the thin plating of gold is protected by an overlying transparent film of inert abrasion-resistant material.

A representative watchband or bracelet 10 is shown in FIG. 1 and consists of the usual intercoupled links L and a suitable latching member or clasp C. As illustrated in FIG. 2, such components are typically fabricated from a suitable base metal 12 (such as brass or stainless steel) which serves as a substrate for a plating 14 of gold, a gold alloy, or other precious metal that provides the desired attractive lustrous finish. As is customary in the gold-plating art, a thin coating 13 of nickel or other suitable metal is deposited on the substrate before the plating operation is performed by electrode position or other well known means. Such an initial coating is referred to as a "strike" in the art and is required to insure that the gold plating bonds properly to the substrate and that a smooth lustrous gold finish is produced if the substrate has a rough surface. Nickel "strikes" on brass substrates typically have a thickness in the order of 0.10 micron (1,000 Angstroms) or so. However, the thickness of such bonding layers is not critical and can be varied according to the plating requirements and the composition and condition of the base metal.

In accordance with one of the important advantages afforded by the present invention, the thickness of the gold plating 14 is drastically reduced and the plated surface of the watch bracelet 10 (or other article) is protected from scratching and abrasion by a film 16 of a selected inert and non-metallic material that tenaciously adheres to the gold-plated surface of the substrate 12. In order to provide adequate long-term protection for the thin "soft" plating 14 of gold without altering its appearance, the protective film 16 must be formed from a material which is much "harder" than gold and is substantially transparent and substantially colorless in thin film form.

Materials which meet all of these requirements and are thus suitable for use as protective films in accordance with the invention are silicon dioxide ($SiO_2$), aluminum oxide ($Al_2O_3$), titanium dioxide ($TiO_2$), silicon nitride ($Si_3N_4$), magnesium oxide (MgO), spinel ($MgO.3.5Al_2O_3$), Corning Glass No. 0080 (soda-lime glass), Corning Glass No. 7070, Corning Glass No. 7740 (PYREX glass), and Corning Glass No. 7059.

The various properties of these materials which make them suitable for use as protective coatings pursuant to the invention are listed in Table I below. For comparison, electroplated gold has a Knoop hardness of about 130 and the thermal expansion coefficients for stainless steel and brass are 173 and $169 \times 10^{-7}/°C.$, respectively.

TABLE I

| Protective Coating Material | Hardness (Knoop) | Refractive Index (n) | Thermal Expansion Coefficient ($\times 10^{-7}/°C.$) |
|---|---|---|---|
| $SiO_2$ | 741 | 1.46 | 8 |
| $Al_2O_3$ | 1370 | 1.78 | 73 |
| $TiO_2$ | 879 | 2.71 | 96 |
| $Si_3N_4$ | 2500 | 1.87 | 45 |
| MgO | 692 | 1.69 | 120 |
| Spinel | 1140 | 1.73 | 59 |
| Corning Glass No. 0080 | 400 (approx.) | 1.512 | 92 |
| Corning Glass No. 7070 | 418 (approx.) | 1.469 | 32 |
| Corning Glass No. 7740 | 418 | 1.474 | 33 |
| Corning Glass No. 7059 | 424 | 1.53 | 46 |

The hardness data given in Table I is the Knoop microhardness for bulk materials and thus provides an indication of the abrasion resistance of the various materials and their ability to protect the underlying plating of gold (or other precious metal).

Corning Glass No. 0080 is a soda-lime silicate type glass that is used in the electric lamp industry for lamp bulbs and the like. Such glasses typically contain 60 to 75% (by wt.) $SiO_2$, 5 to 18% $Na_2O$, 3 to 13% CaO or MgO (or a mixture thereof) and minor amounts of additional materials such as $Al_2O_3$, and $K_2O$. A specific example of a glass composition of this type is as follows: 73.6% $SiO_2$, 16% $Na_2O$, 3.6% MgO, 5.2% CaO, 1% $Al_2O_3$ and 0.6% $K_2O$.

Corning Glass Nos. 7070 and 7740 are borosilicate type glasses that contain major amounts of $SiO_2$ and $B_2O_3$ and various minor constituents. Glass No. 7740 is marketed by Corning under the trade name "Pyrex" glass. A specific example of a No. 7740 type glass is as follows: 80.5% (by wt.) $SiO_2$, 12.9% $B_2O_3$, 2.2% $Al_2O_3$, and 0.4% $K_2O$.

A specific example of a No. 7070 type glass composition is as follows: 70% (by wt.) $SiO_2$, 28% $B_2O_3$, 1.2% $Li_2O$, 1.1% $Al_2O_3$, 0.2% MgO, 0.5% $K_2O$ and 0.1% CaO.

Corning Glass No. 7059 is an aluminoborosilicate type glass which typically has the following composition; 50.2% (by wt.) $SiO_2$, 25.1% BaO, 13.0% $B_2O_3$, 10.7% $Al_2O_3$ and 0.4% $As_2O_3$.

Other dielectric type materials that are suitable for use as protective films in accordance with the invention are silicon carbide (SiC) which has a Knoop hardness of 2500, tantalum oxide ($Ta_2O_5$), niobium oxide ($Nb_2O_5$) and germanium oxide ($GeO_2$). Another glass which has also been found suitable is a high-lead-content solder glass which has a thermal expansion coefficient of $117 \times 10^{-7}/°C$. and typically contains 85% (by wt.) PbO, 7.5% $B_2O_3$ and 7.5% $SiO_2$.

As indicated by the data given in Table I, the material which is used to form the protective film 16 should have a refractive index that is in the range of from about 1.4 to about 2.8.

In general, any material that has a Knoop hardness of 400 or more, is inert, and has the ability to be deposited in thin adherent films that are of controlled thickness and are also substantially transparent and colorless in such thicknesses can be used as the protective coating. If the thermal expansion characteristic of the protective material relative to the substrate is such that flaking, cracking or peeling of the film occurs, then an intervening layer (or layers) of other materials must be used as hereinafter disclosed to correct the mismatch. Various types of clear glass compositions (such as the aforesaid solder glass) that have thermal expansion coefficients which approximate that of stainless steel, for example, can also be used.

While the protective film 16 can be formed on the plated substrate 12 by various means including electron beam evaporation and chemical vapor-deposition techniques, deposition by RF-sputtering is preferred because sputtered films, in general, exhibit excellent adhesion, are dense and free from pinholes, provide satisfactory substrate coverage, and have the proper stoichiometry.

As is well-known, transparent films will produce coloration due to optical interference or so-called "Newton ring" effects when the optical thickness (the product of the true or mechanical thickness and the refractive index) of the film is roughly of the same order of magnitude as the wavelength of light (from about 3,000 to 8,000 Angstroms). The film thickness range which enables incident light rays to produce such interference color effects thus depends upon the refractive index of the coating material and generally lies between 0.05 micron (500 Angstroms) and 1.5 microns (15,000 Angstroms) for the materials which are listed in Table I or referred to as being suitable. Hence, in order to avoid such undesirable discoloration of the gold-plated surface of the watchband 10 (or other article which is being protectively coated), the thickness of the protective film 16 must either be less than about 500 Angstroms or greater than about 15,000 Angstroms for these materials.

Since films with thicknesses less than 500 Angstroms would be too thin to provide adequate "long term" abrasion protection, protective films formed from the aforementioned materials must have thicknesses that are greater than about 15,000 Angstroms. Protective films that are too thick, however, must also be avoided since they will tend to crack or peel away from the substrate. Since the film thickness above which optical interference coloration effects are not discernible varies inversely with the refractive index of the coating material, a thinner film of a high refractive index material can be employed. This is desirable from a manufacturing standpoint since shorter film-deposition times will be required and peeling will be inhibited. The following materials are preferred in this respect since they have high indices of refraction (shown in parenthesis): SiC (2.73), $Nb_2O_5$ (2.24), $Ta_2O_5$ (2.21), $TiO_2$ (2.71), GeO (2.1) and $Si_3N_4$ (1.87).

The sputtering yield provides a relative indication of how easily a given material can be sputtered from a target and, hence, how rapidly a protective film of that material can be formed by sputter-deposition. This is an important consideration when coating in mass-production quantities is involved. In general, the ideal material for the protective coating from both a quality and manufacturing standpoint is thus a material which has high values for hardness, refractive index, and sputtering yield.

TEST DATA AND SPECIFIC EXAMPLES

Preliminary tests performed on small stainless-steel plates which were coated with a 2.5 microns (25,000 Angstroms) thick electroplated layer of 24 K gold have indicated that protective coatings of $SiO_2$, $Al_2O_3$, $TiO_2$, $Si_3N_4$ and SiC which were formed by RF-sputtering exhibited excellent adhesion and protection of the substrates against abrasion. A portion of each of the gold-plated test plates was masked during deposition of the protective film to provide an uncoated "gold reference" surface for evaluation. Film adhesion was checked by a so-called "tape test" which consisted of firmly pressing a piece of "Scotch" brand adhesive tape onto a film-coated portion of the test plate and then stripping the tape away. This is a very demanding test since any material which is not firmly bonded or securely anchored to the substrate will be lifted from its surface when the adhesive tape is stripped away. Abrasion resistance was determined by vigorously rubbing the coated and uncoated portions of the test plates with a pencil eraser and then with steel wool. The appearance of the coated portions of the plates was evaluated visually by noting any discoloration effects or undesirable altering of the natural color of the gold plating.

These preliminary tests verified that very thin films of the tested materials in the thickness range below that were required to avoid optical interference effects (that is, less than about 0.05 micron or 500 Angstroms) would not provide adequate "long-term" abrasion protection of the gold-plated substrates. The sputtered films of SiC had a yellowish-brown tint and altered the natural gold color of the samples to a certain degree. Such films would, accordingly, be satisfactory only where a slight discoloration of the plated surface could be tolerated (or might even be desirable). Although the sputtered films of $TiO_2$ were colorless and (due to their high refractive index) were devoid of any optical interference coloration even though they were only 1.5 microns or 15,000 Angstroms thick, the high refractive index of this material caused the film surface to have a high reflectivity which tended to mute the gold color of the substrate and slightly modify its appearance. The $Al_2O_3$ sputtered very slowly and would thus probably not lend itself to mass production operations.

Experiments have indicated that the sputtering yield of $Si_3N_4$ is comparable to that of $SiO_2$ (0.13 molecule per ion at 1 kilovolt target voltage) and these two materials are thus good selections for protectively coating gold-plated substrates where coating times and costs are critical factors.

Test data obtained with $SiO_2$ films of varying thickness on gold-plated stainless steel sample plates have shown that protective films of this material that were approximately 1.4 microns or 14,000 Angstroms thick exhibited pale pink and green interference colors which indicated that the films were too thin. When films of $SiO_2$ 5 microns or 50,000 Angstroms thick were deposited on such gold-plated sample substrates, the coatings cracked and flaked from the substrates due to high stresses present within the thick films. $SiO_2$ films 3.4 microns (34,000 Angstroms) thick adhered well to the gold-plated substrates and also had excellent abrasion resistance, on the basis of the "eraser and steel wool" test. The color of the coated plates was indistinguishable from the original gold-plated substrate. Pursuant to these experimental data, the optimum thickness range for $SiO_2$ protective films on gold-plated articles is accordingly within the range of about 1.5 to about 4 microns (that is, from about 15,000 to about 40,000 Angstroms).

Similar tests conducted on gold-plated watch bracelets 10 of the type shown in FIG. 1 confirmed the foregoing early test data obtained on plate samples. These additional tests revealed that cleanliness of the gold-plated substrates prior to deposition of the protective film is quite important. Some of the sample watchbands apparently had an organic film or coating on their surfaces which may have been intended to serve as a protective coating by the manufacturer. This contamination produced undesirable brown stains when $SiO_2$ protective films were applied and also caused flaking of the films. These coating problems were solved by subjecting the watchbands to a cleaning procedure which consisted of boiling the components in a suitable detergent, rinsing them in deionized water and methyl alcohol, and then drying them in air at around 120° C.

The additional series of tests also indicated that the optimum thickness of $SiO_2$ protective films was somewhat less for the gold-plated watchbands than for the gold-plated test blanks of metal. Films between about 2 and 3.5 microns thick tended to flake from the watchbands and no undesirable interference color effects were produced if the film thickness was greater than about 1.4 microns. The optimum thickness for protective films of $SiO_2$ in the case of gold-plated watchbands of the kind shown in FIG. 1 is accordingly within the range of from about 1.4 to about 2 microns (that is, from about 14,000 to about 20,000 Angstroms).

The differences in the observed interference effects for $SiO_2$ films deposited on the test blanks of gold-plated metal and on the gold-plated watchbands may have been due to the smooth surface finish of the test blanks and the fact that the watchbands had a textured surface finish.

A most important advantage afforded by the present invention from a cost standpoint is the fact that wristwatch bracelets and other components for fine watches (as well as various articles of fine jewelry) can be provided with a much thinner plating of gold without detracting in any way from the quality or appearance of the components or articles since the natural appearance of the gold plating is preserved by the transparent film of protective material. As shown in FIGS. 1 and 2, a watchband 10 of high quality having a stainless steel substrate 12 which is provided with a nickel "strike" 13 about 1,000 Angstroms thick and then plated with a layer 14 of gold approximately 0.5 micron or 5,000 Angstroms thick (dimension "$t_1$") can accordingly be made by protectively coating the thin layer of gold with a film 16 of $SiO_2$ (or similar transparent material) that is approximately four times as thick as the gold-plating—that is, a protective film of $SiO_2$ approximately 2 microns or 20,000 Angstroms thick. The relative thicknesses of the gold plating, the bonding layer or "strike" and the protective film are substantially as shown in FIG. 2. Hence, the gold plating 14 is only one-fourth as thick as the protective film 16, and the nickel "strike" 13, in turn, is only one-fifth as thick as the gold plating.

If the article or substrate is such that it can be coated with a thinner layer of gold which still retains the natural appearance and color of solid gold, then gold coatings in the order of about 0.2 or 0.3 micron (about 2,000 or 3,000 Angstroms) can be used in combination with the protective film of the invention.

Figure 3:
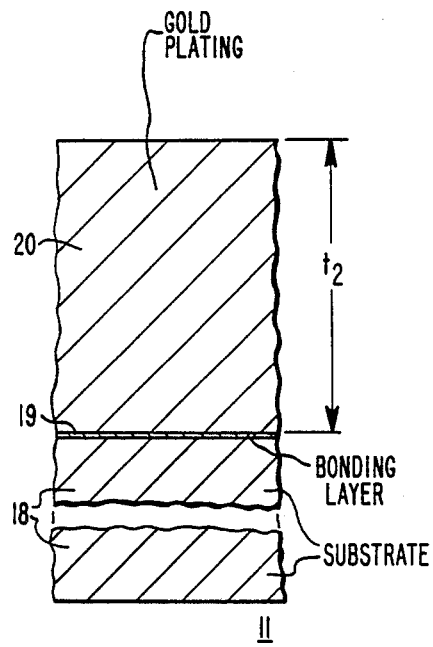
FIG. 3 is a similar cross-sectional view of a conventional watch bracelet, on the same scale, and illustrates the much thicker gold plating commonly employed in the prior art for such watch components in the absence of the protective coating means of the present invention.

In contrast, conventional watch bracelets 11 (shown in FIG. 3) of good quality having similar substrates 18 of stainless steel which is primed by a nickel "strike" 19 about 1,000 Angstroms thick generally have a gold plating 20 that is approximately 10 microns or 100,000 Angstroms thick (dimension "$t_2$")—that is, twenty times thicker than the gold plating 14 employed in accordance with the invention. FIGS. 2 and 3 are drawn to the same scale so that the relative thicknesses of the two gold platings 14 and 20 is accurately shown in and apparent from the drawing.

Hence, the present invention permits the thickness of the gold platings employed on such fine watch components to be reduced by at least 95% (5,000 Angstroms versus 100,000 Angstroms) and up to 98% or so (2,000 Angstroms versus 100,000 Angstroms) with a corresponding reductions in the manufacturing cost of the watches. In view of the high cost of gold and other precious metals, the cost saving is very significant and constitutes an important competitive advantage, not only in the watch industry but in the manufacture of fine jewelry and similar articles that are composed of a base metal and presently require heavy coatings or platings of a precious metal to preserve their appearance.

ALTERNATIVE "PRIMER LAYER" EMBODIMENT (FIG. 4)

Further tests on protective films for gold-plated articles such as watch bracelets have shown that an additional reduction in their manufacturing cost can be realized by depositing the gold layer on the watch bracelets by sputtering techniques (rather than electroplating) so that both the gold-coating and protective-coating operations can be performed sequentially within the vacuum chamber of the RF-sputtering apparatus. Experiments confirmed that this could be achieved quite readily by providing one target of gold and another target of $SiO_2$ (or other material from which the protective film is to be formed) within the vacuum chamber and then simply operating the sputtering apparatus in two different modes which selectively bombarded the targets to first deposit the required layer of sputtered gold onto the watchbands of base metal and then coat the resulting gold-coated surface with a film of sputtered $SiO_2$, the required thicknesses being obtained by properly controlling the target voltage, power input and the length of the sputtering operation in each mode.

A further advantage afforded by this method of sequentially-coating was the ability to sputter-coat the watchbands with a layer of 24K gold instead of the 14K gold conventionally used in the electroplating process. The sputtered-gold layers thus had a deeper and richer gold color (due to the higher gold content) compared to watchbands with gold-electroplated coatings—even though the sputtered-gold layers were much thinner and used less gold.

During the course of these experiments, it was also discovered that both the adherence and durability of the sputtered-gold coatings could be improved by depositing a very thin layer of titanium (Ti) on the stainless steel substrate before sputter-depositing the gold layer. The use of a sputtered film of Ti about 200 Angstroms thick permitted a layer of sputtered gold less than 0.5 micron thick (5,000 Angstroms) to pass the "tape test" for adhesion. Such a preliminary or "primer" layer of Ti accordingly enables sputtered gold layers approximately 0.25 or 0.3 micron thick (2,500 or 3,000 Angstroms) to be employed on substrates—thus providing a corresponding further reduction in coating and material cost without detracting from the appearance of the finished article as regards its natural gold "finish" and appearance.

Figure 4:
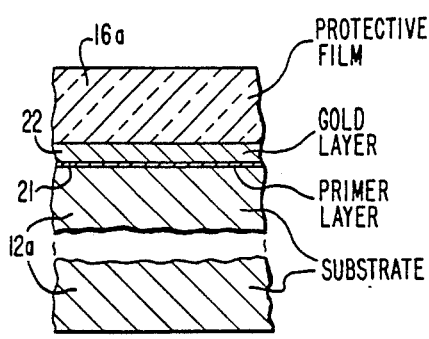
FIG. 4 is a similar cross-sectional view of another embodiment wherein the substrate is provided with an adhesion-promoting primer layer before being coated with a sputtered layer of gold or the like and then protectively coated.

A watch bracelet 10a (or other article) having a substrate 12a of a base metal (such as stainless steel or the like) that is provided with the composite sputtered coating according to this embodiment as shown in FIG. 4. As will be noted, the substrate 12a has a thin primer layer 21 of titanium deposited on its surface to promote the adhesion of a layer 22 of sputtered gold which, in turn, is protected by a film 16a of $SiO_2$ or other suitable material that is substantially transparent and does not noticeably alter the natural appearance or finish of the gold layer.

The film thickness of the adhesion-promoting primer-layer 21 of titanium is not especially critical and can be in the range of from about 50 to 400 Angstroms. Suitable thin films of other metals such as chromium, nickel and Nichrome type alloys that have a similar adhesion-promoting effect can also be used. Nichrome alloys are well known in the art and are composed of about 80% (by wt.) nickel and about 20% chromium.

The manufacture of the watch bracelet 10a or other article will also be facilitated if the primer layer 21 of titanium (or other metal) is sputter-deposited on the substrate 12a in sequential fashion with the overlying layers of gold and protective material in a common vacuum chamber of a properly modified and controlled RF-sputtering apparatus.

ALTERNATIVE "BUFFER LAYER" EMBODIMENT (FIG. 5)

Figure 5:
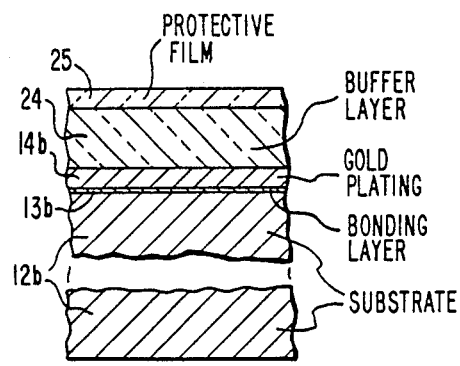
FIG. 5 is a fragmentary cross-sectional view on an enlarged scale of still another embodiment wherein a buffer or transition layer of a selected glass is employed between the transparent protective film and the plated surface of the substrate to compensate for the difference in the thermal expansion coefficients of the plated substrate and protective film.

Another form of composite protective coating for gold-plated watch components and similar articles is shown in FIG. 5 and was developed to overcome an adherence problem encountered during trial runs using a production type sputtering system which operated at high deposition rates. When sputtering protective films of $SiO_2$ onto gold-plated stainless steel watchbands using such a system, it was discovered that the protective films sometimes flaked from the watchbands upon removal from the sputtering apparatus. While the exact cause of this problem is unknown, it is believed that it may be due to excessive heating of the watchbands produced by the high rate at which the sputtered material was deposited—in combination with the subsequent cooling and a thermal expansion coefficient mismatch between the $SiO_2$ film and stainless steel substrate which induced stresses in the films with resultant flaking.

It was found that this problem could be solved by using an additional transparent layer of a suitable material between the $SiO_2$ film and the gold-plated stainless steel substrate, which additional layer is composed of a material that has a thermal expansion coefficient between that of $SiO_2$ ($8 \times 10^{-7}/°C$.) and that of stainless steel ($173 \times 10^{-7}/°C$.). The additional layer thus serves as a buffer or "transition" layer that compensates for the expansion mismatch between the substrate and protective $SiO_2$ film without interfering with the ability of the film to protect and preserve the natural appearance of the gold plating.

The soda-lime silicate type glass marketed by the Corning Glass Company under the trade designation Corning Glass No. 0080 (listed in Table I) is a material particularly suitable for use as such a buffer layer since it has a thermal expansion coefficient of $92 \times 10^{-7}/°C$. (about midway between that of stainless steel and $SiO_2$) and is transparent and colorless in the thicknesses required. This glass composition also has an index of refraction of 1.512 and a Knoop hardness of about 400 as indicated in the Table. However, any of the glasses listed in Table I (as well as the aforementioned solder glass) can be used as a buffer material since they all have thermal expansion coefficients that are much higher than that of $SiO_2$. Since materials such as $TiO_2$ and $Al_2O_3$ have high coefficients of thermal expansion, they are also especially suited for use as a buffer material.

Tests have shown that stainless steel watchbands provided with a gold layer (either plated or sputtered) approximately 5,000 Angstroms thick can be provided with a sputtered composite transparent protective coating that exhibits excellent adhesion and durability and consists of a layer of Corning No. 7059 Glass about 1.5 microns thick (15,000 Angstroms) that was covered by a film of $SiO_2$ approximately 0.5 micron (5,000 Angstrom) thick. The relative thicknesses of the transition or buffer layer of glass and the $SiO_2$ film are not critical and can vary considerably from the stated values. For example, the film thickness of the $SiO_2$ can be within the range of from about 0.2 micron to about 2 microns (2,000 to 20,000 Angstroms) and the buffer layer of glass can be from about 1 to 4 microns thick (10,000 to 40,000 Angstroms). However, the combined thicknesses of the protective film and buffer layer must be sufficient to prevent the occurrence of optical interference effects and undesired coloration of the gold-coated surface of the article.

As illustrated in FIG. 5, a watchband 10b or other article according to this embodiment consists of a substrate 12b of stainless steel (or other base metal), a "strike" or bonding layer 13b of nickel or the like, a thin plating 14b of gold (or other precious metal) that is protectively shielded from scratching and other damage by a substantially transparent and colorless composite coating which consists of the buffer layer 24 of a selected glass and a much thinner layer 25 of SiO$_2$ or other suitable abrasion-resistant material.

ALTERNATIVE MULTIPLE "BUFFER-LAYER" EMBODIMENT (FIG. 6)

Figure 6:
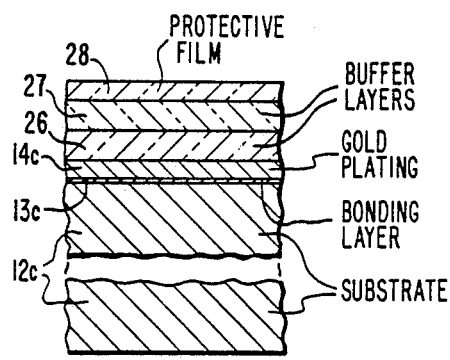
FIG. 6 is a similar view of an alternative embodiment in which two buffer or transition layers of different glasses are employed.

The invention is not limited to the use of a single layer of a buffer material to correct the mismatch of the thermal expansion and contraction characteristics of the gold-plated substrate and the protective film but includes within its scope the use of two or more buffer layers for this purpose. A multiple buffer-layer embodiment 10c is shown in FIG. 6.

As illustrated, this embodiment comprises a substrate 12c of a base metal, the usual very thin "strike" or bonding layer 13c of nickel or the like, a gold plating 14c of reduced thickness, two buffer layers 26, 27 of two different substantially transparent colorless materials that have thermal expansion coefficients which provide a "two-step" transition from the high expansion coefficient of the plated substrate 12c to the much lower expansion of the transparent protective film 28.

In the case of a stainless steel gold-plated substrate and a protective film of SiO$_2$, a first buffer layer of soda-lime silicate glass (No. 0080 glass) and a second buffer layer of Corning No. 7059 Glass would be a good combination of buffer materials since they would provide a "balanced" transition from 173 to 92 to 46 to 8 (in terms of the expansion coefficients of the respective materials, starting with the substate).

The thickness of the buffer layers is not critical but they obviously should be thin enough to maintain the composite coating below about 40,000 Angstroms or so. They may be of equal thickness (as shown in FIG. 6) or their relative thickness can be varied and correlated with the expansion coefficients of the particular materials to provide an optimum "gradation" of stress forces at the interface of the substrate and protective film. However, in FIG. 6 the total thickness of the illustrated composite coating (that is, buffer layers 26, 27 and the protective film 28) is the same as the thickness of the composite coating used in the single-buffer layer embodiment shown in FIG. 5. This is preferred since it would reduce the sputter-coating times to a minimum.

ALTERNATIVE SINGLE-COATING EMBODIMENT (FIG. 7)

The invention is also suitable for use in protectively coating articles that are entirely composed of a material (such as brass or silver) that is rapidly degraded or becomes tarnished by chemical attack from oxygen or pollutants in the atmosphere in which they are used.

Figure 7:
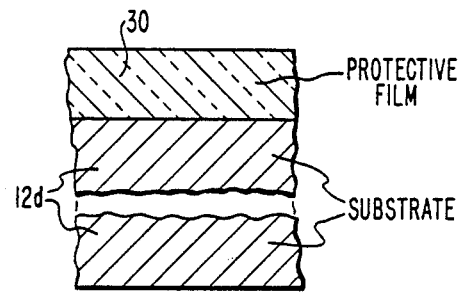
FIG. 7 is a cross-sectional view of yet another embodiment wherein a transparent protective film of a selected inert material is deposited directly onto the unplated surface of a substrate or article that is composed of tarnishable metal.

As shown in FIG. 7, in accordance with this embodiment the unplated article 10d itself (a silver bowl or tray, or a brass name-plate, for example) constitutes the substrate 12d that is provided with the substantially transparent and colorless protective film 30 of SiO$_2$ (or other suitable abrasion-resistant material such as those listed in Table I and in the text immediately following the Table). The thickness of the film 30, as in the previous embodiments, must be properly correlated with the refractive index of the particular protective material to avoid optical interference effects and resultant undesirable coloration that would otherwise be produced by incident light rays. Since the aforementioned solder glass has a thermal expansion coefficient of $117 \times 10^{-7}/°C.$, it can also be used to form the protective film 30 in those instances where the article is composed of a metal that also has a high expansion coefficient. For example, a protective film of this type glass (or any of the other glasses listed in Table I) would be suitable for use on silver trays, brass commemorative plaques or brass name-plates used on buildings and the like, especially since such articles are not subjected to severe abrasion during normal use.

If the protective film 30 is composed of a much harder material such as TiO$_2$, SiO$_2$, MgO or the like, then it can be used in conjunction with watchbands or watch cases that are composed of solid brass and are thus not coated or plated with gold or another precious metal. Experimental tests have demonstrated that sputtered SiO$_2$ films adhere very well to brass articles and produce a body color that is very similar to gold. SiO$_2$ films 2.58 microns thick (25,800 Angstroms) were free of blemishes and abrasion-resistant when sputter-deposited on a clean brass watchcase.

ALTERNATIVE "MULTI-THIN-FILM" EMBODIMENT (FIG. 8)

Figure 8:
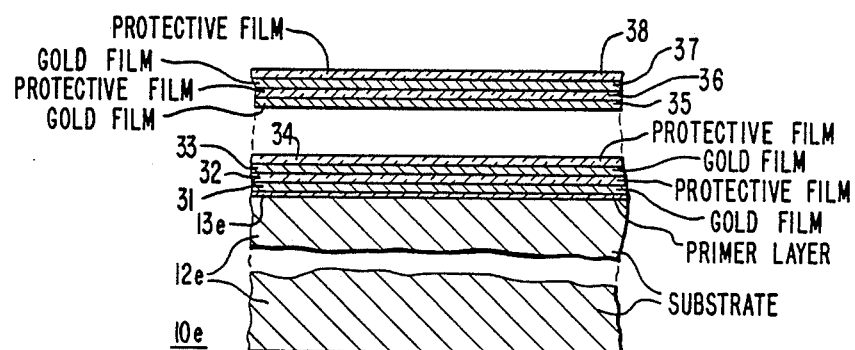
FIG. 8 is a cross-sectional view of another embodiment of the invention wherein alternating very thin films of a precious metal (such as gold) and a transparent protective material are employed to further reduce the amount of precious metal required to plate an article.

Another form of composite layer that permits even thinner coatings and smaller amounts of gold or other precious metals to be employed on substrates of a base metal is shown in FIG. 8.

According to this embodiment, an article 10e (such as a bracelet for a wristwatch or a piece of jewelry) that is composed of a base metal (such as stainless steel or the like that serves as a substrate 12e) is coated with a primer layer 13e of titanium or a similar material and then with a plurality of very thin films 31, 33, 35, 37 of sputtered gold (or other precious metal) and a plurality of interposed thin films 32, 34, 36, 38 of sputtered SiO$_2$ (or other transparent and inert protective material). The series of alternately-disposed sputter-deposited films of gold and SiO$_2$ form a very hard and durable composite coating whose outer surface consists of an SiO$_2$ film 38 and whose inner surface is a layer 31 of gold that is bonded to the primer-coated substrate 12e. While a total of eight interposed and overlapped films 31-38 are shown in FIG. 8, any suitable or required number can be employed (as indicated by the "break-away" in the composite coating). Tests conducted with substrates having a total of ten such films gave satisfactory results.

The alternating films can be very thin (for example, less than about 100 Angstroms thick) and provide several advantages in that they greatly reduce the sputtering times (and thus the overall coating cost) but still produce an article 10e with a finish that has the natural look of gold but has excellent abrasion-resistant properties and actually contains a very small total amount of gold metal. As the top films "wear away" due to their extreme thinness, the next layer (of gold or SiO$_2$) provide the desired gold "finish" appearance.

The total amount of gold in such multi-film composite coatings can be further reduced by making the gold films thinner than the films of protective material—for example, gold films that are around 50 Angstroms thick in combination with SiO$_2$ films about 100 Angstroms thick. Hence, a composite coating having a total of forty such films would have an overall thickness of only 3,000 Angstroms (with the aggregate or "total" film thickness of the gold films being only 1,000 Angstroms and thus requiring a very small quantity of gold).

Since the interposed protective films are so thin, they do not produce any optical interference effects or discoloration of the underlying gold films and can be sputter-deposited very rapidly. Flaking or peeling of the films is also not a problem since the sputtered materials are intimately bonded to one another and are not thick or brittle enough to create stresses due to mismatches of thermal expansion coefficients, either with respect to the interposed films themselves or with respect to the base-metal substrate.

While the combination of interposed films of $SiO_2$ and gold have been referred to in the embodiment just described, it will be apparent to those skilled in the art that various other combinations of materials can be used—depending upon the type of article involved (for example, alternating films of silver and spinel or a suitable glass, alternating films of platinum and $TiO_2$ or MgO, etc.).

WATCHCASE EMBODIMENT (FIG. 9)

Figure 9:
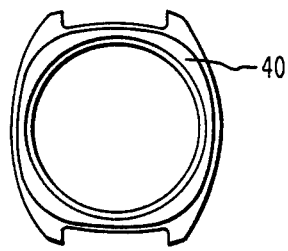
FIG. 9 is a plan view of a case for a wristwatch which is representative of other types of metallic articles that can be protectively coated in accordance with the invention.

The invention is not limited to protectively coating bracelets or bands for wristwatches but includes within its scope the provision of transparent abrasion-resistant coatings (consisting of one or several films) on other components for wristwatches such as watchcases 40 of the type shown in FIG. 9. Such cases can either comprise a gold-plated base metal (such as stainless steel or brass) or they can be composed of a metal such as brass that is not plated with gold but has a body color which is very similar to gold.

The various protective films and composite protective coatings of the present invention can accordingly be used on any article of manufacture that has a metallic surface which is degraded or tarnished by chemical attack from the atmosphere or from pollutants in the atmosphere in which the article is used. The films and coating can also be used on articles such as jewelry and decorative components which have a substrate that is composed of a base metal (such as stainless steel or the like) that is coated with a relatively soft metal (such as gold) which is easily scratched and has poor "wearing" characteristics.

Another more limited but important benefit afforded by the protective films and coatings of the present invention is in the prevention of "allergic" type reactions which some persons experience when wearing rings or chains, etc., that are composed of a certain metal or alloy. Since all of the materials listed are chemically inert and stable, a thin film of such material physically isolates the wearer's skin from the reaction-causing metal and thus permits the ring or other article to be worn without any undesirable biological effects or reactions. This is especially true in the case of the glass or glass-like film-forming materials listed or mentioned previously.

SPECIFIC EXAMPLE OF SPUTTER-COATING PROCESS

Following is a specific example of the manner in which the substantially transparent abrasion-resistant films or coatings of the present invention are applied to articles or substrates by sputter-deposition using experimental apparatus.

The articles or substrates are loaded into an RF-sputtering apparatus along with a suitable target of the selected coating material, a 6-inch diameter target of $SiO_2$ for example. The sputtering chamber is then evacuated to a pressure of about $5 \times 10^{-7}$ Torr and filled with approximately $1.4 \times 10^{-2}$ Torr of a mixture of 90% argon and 10% oxygen which serves as the sputtering gas. An RF target voltage of 750 volts is then applied to the target so that the power input is around 200 watts. The sputtering apparatus was operated for approximately 10 hours under these conditions and films of $SiO_2$ having a thickness of from 1.5 to 2.0 microns (15,000 to 20,000 Angstroms) were deposited on the substrate. If a production type magnetron RF-sputtering apparatus were used, the time required to deposit $SiO_2$ films of such thicknesses could be reduced to approximately 1 or 2 hours.

As will be appreciated to those skilled in the art, the operating parameters of the sputtering apparatus can be adjusted in accordance with the sputtering yields, etc., of the various coating materials so that films of the thicknesses required for each of the described embodiments can be readily and efficiently deposited.

ADDITIONAL SPECIFIC EXAMPLES OF VARIOUS EMBODIMENTS

In addition to the experimental and test samples and data described previously, following are specific examples of additional embodiments that have been made and evaluated:

FIG. 4 Embodiment—a stainless steel watchband was first coated with a primer layer of Ti 260 Angstroms thick which was sputter-deposited in a chamber evacuated to a pressure of $4 \times 10^{-7}$ Torr and then filled with argon (the sputtering gas) to a pressure of $1.4 \times 10^{-2}$ Torr. The Ti film was deposited in approximately eleven minutes using an RF target voltage of 950 volts and a power input of around 200 watts. A gold film 4,900 Angstroms thick was then sputter-deposited (without removing the watchband from the chamber) by operating the sputtering apparatus for twenty minutes (with a 24K gold target) at a target voltage of 750 volts and 100 watts power input. A protective film of $SiO_2$ approximately 20,000 Angstroms thick was then sputter-deposited by operating the apparatus at a target voltage of 750 volts and 200 watt power input for ten hours (using an $SiO_2$ target). The coatings adhered very well to the substrate and the $SiO_2$ film was colorless and passed the abrasion and adhesion tests described previously.

FIG. 5 Embodiment—A stainless steel watchband, which was previously electroplated with gold in the conventional manner, was provided with a buffer layer of Corning No. 7059 glass that was 1.5 microns (15,000 Angstroms) thick and then coated with a protective film of $SiO_2$ 0.5 micron (5,000 Angstroms) thick by operating an RF-sputtering apparatus in sequential fashion with two different targets. The sputtering chamber was first evacuated to a pressure of $6 \times 10^{-7}$ Torr and then filled with a sputtering gas consisting of 90% argon and 10% oxygen at a pressure of $1.4 \times 10^{-2}$ Torr. The buffer layer of glass was deposited by operating the apparatus at a target voltage of 450 volts and a power input of 300 watts for four and one-half hours, and the $SiO_2$ film was deposited by using a target voltage of 750 volts and operating the apparatus for three hours at 200 watts input.

FIG. 7 Embodiment—A brass watchcase was coated with a transparent colorless protective film of $SiO_2$ 2.58 microns (25,800 Angstroms) thick by first evacuating the sputtering chamber to a pressure of $5 \times 10^{-7}$ Torr, then filling it with a sputtering gas consisting of 90% argon and 10% oxygen at a pressure of $1.4 \times 10^{-2}$ Torr and operating the apparatus for fifteen hours at 200 watts input and 750 volts applied to the $SiO_2$ target. The $SiO_2$ film adhered well, had no visual defects and passed the aforementioned "tape" and abrasion tests.

As will be apparent to those skilled in the art, when the precious metal coating or plating on the article consists of gold, it need not be composed of pure (24K) gold but can comprise a suitable gold alloy (for example, 10K or 14K gold, etc.).

I claim as my invention:

1. In the manufacture of a metallic article of merchandise that is subjected to frequent human contact during normal usage of the article and is thus exposed to abrasion and/or corrosion damage by such contact and usage, the method of coating said metallic article with a different metal that enhances the aesthetic appeal of the article but is susceptible to such abrasion and/or corrosion damage and then providing the coated surface of the article with a substantially-transparent protective film of a selected non-metallic abrasion-resistant material which does not substantially alter the color or appearance of said coated surface, said selected abrasion-resistant material having a predetermined refractive index, which method comprises;

placing the metallic article in the coating chamber of a radio-frequency type sputtering apparatus along with a quantity of the metal to be deposited on the article and a quantity of an abrasion-resistant material selected from the group consisting of $SiO_2$, SiC, $Si_3N_4$, $TiO_2$, MgO, $Al_2O_3$, $Ta_2O_5$, $Nb_2O_5$, GeO, spinel, and glasses that have a Knoop hardness of over about 400 and consist essentially of mixed oxides, evacuating said chamber and, after introducing a sputtering gas therein, operating the sputtering apparatus in a first mode such that a sputtered layer of the coating metal is deposited on said article, and while the metal-coated article is still in the gas-filled coating chamber, operating the sputtering apparatus in a second mode such that a sputtered film of the abrasion-resistant material is deposited over the metal-coated surface of the article, the duration of the second sputtering operation being so correlated with the refractive index of the abrasion-resistant material that the deposited protective film of abrasion-resistant material is substantially transparent and of a thickness between about 14,000 Angstroms and 40,000 Angstroms, to prevent undesirable discoloration of the coated article due to optical interference effects that would otherwise be produced by incident light rays and thus alter the natural aesthetic appearance of the underlying metallic coating, and to allow adhesion to the article.

2. The method of claim 1 wherein;
said metallic article comprises a piece of jewelry or a wristwatch component that is composed of a base metal and the metal with which it is coated comprises a precious metal, and where the glass that can be used as the protective film is a mixture of oxides selected from the group consisting of $SiO_2$, $Na_2O$, CaO, MgO, $Al_2O_3$, $K_2O$, $B_2O_3$, $Li_2O$, and PbO, and has a refractive index in the range of from about 1.4 to about 2.8.

3. The method of claim 1 wherein said metallic article comprises a component for a wristwatch that is composed of stainless steel or brass and is coated with a layer of gold or gold alloy which is deposited by the first sputtering operation.

4. The method of claim 3 wherein the sputtered layer of gold or gold alloy has a thickness that does not exceed about 5,000 Angstroms, and the protective film of abrasion-resistant material comprises $SiO_2$ that has a thickness between about 14,000 Angstroms and 40,000 Angstroms.

5. In the manufacture of a metallic article of merchandise which has a surface that enhances the aesthetic appeal of the article but is exposed to the atmosphere and frequent human contact during normal use of the article and is susceptible to abrasion damage and/or tarnishing as a result of such exposure, the method of protecting the surface of said metallic article comprising;

placing the article in the deposition chamber of a sputtering apparatus along with a target composed of a selected non-metallic abrasion-resistant, chemically inert material selected from the group consisting of $SiO_2$, SiC, $Si_3N_4$, $TiO_2$, MgO, $Al_2O_3$, $Ta_2O_5$, $Nb_2O_5$, GeO, spinel, and glasses that have a Knoop hardness of over about 400 and consist essentially of mixed oxides that when sputter-deposited, forms a protective film that is substantially transparent, orienting the article so that the surface thereof which is to be protected will be exposed to and be coated with sputtered material from said target when the apparatus is operated, and then operating said apparatus and thereby sputter-depositing a substantially-transparent protective film of the said non-metallic abrasion-resistant material between about 14,000 Angstroms and 40,000 Angstroms thick on the surface of the article, the time period which said apparatus is operated and the thickness of the resulting sputter-deposited substantially-transparent protective film of abrasion-resistant material both being so correlated with the refractive index of said material so that the sputtered film is substantially devoid of undesirable discoloration effects that would otherwise be produced by optical interference of incident light rays which enter the transparent protective film, and so that the sputtered film adheres to the article.

6. The method of claim 5 wherein, the glass that can be used as the protective film is a mixture of oxides selected from the group consisting of $SiO_2$, $Na_2O$, CaO, MgO, $Al_2O_3$, $K_2O$, $B_2O_3$, $Li_2O$, and PbO, and has a refractive index in the range of from about 1.4 to about 2.8.

7. The method of claim 5 wherein;
said article is composed of a base metal and the said surface of the article comprises a coating of precious metal which is also susceptible to scratching during normal use of the article, and
said protective film is formed sufficiently abrasion-resistant to permit the precious metal coating to be thinner than the coating which would otherwise have to be employed to avoid exposing the base metal after prolonged use of the article.

8. The method of claim 7 wherein said precious metal coating is composed of gold or a gold alloy and said protective coating is $SiO_2$.

9. The method of claim 8 wherein said article comprises a piece of jewelry.

10. The method of claim 8 wherein said article comprises a case or bracelet component for a wristwatch.

11. In the manufacture of a metallic article of merchandise that is subjected to frequent human contact during normal usage of the article and is thus exposed to abrasion, corrosion and/or tarnishing by such usage and contact, the method of coating said metallic article with a different metal that enhances the aesthetic appeal of the article but is susceptible to such abrasion damage and degradation and then providing the coated surface of the article with a substantially-transparent protective film of a selected non-metallic abrasion-resistant material which does not substantially alter the color or appearance of said coated surface, said selected abrasion-resistant material having a predetermined refractive index, which method comprises;

placing the metallic article in the coating chamber of a radio-frequency type sputtering apparatus along with (a) a quantity of the different metal to be deposited on the article, (b) a quantity of an abrasion-resistant material selected from the group consisting of $SiO_2$, $SiC$, $Si_3N_4$, $TiO_2$, $MgO$, $Al_2O_3$, $Ta_2O_5$, $Nb_2O_5$, $GeO$, spinel, and glasses that have a Knoop hardness of over about 400 and consist essentially of mixed oxides, from which the protective film is to be formed, and (c) a quantity of a selected metallic primer material which is adapted to enhance the adhesion of the coating metal, evacuating said chamber and, after introducing a sputtering gas therein, operating the sputtering apparatus in a first mode for a predetermined time such that a coating of sputtered metallic primer material is deposited on said article, and while the primer-coated article is still in the gas-filled coating chamber, sequentially operating the sputtering apparatus in second and third modes such that a layer of sputtered coating metal and a protective film of sputtered abrasion-resistant material are sequentially deposited over the primer-coated surface of the article, the duration of the third sputtering operation being so correlated with the refractive index of the abrasion-resistant material that the protective film of sputtered abrasion-resistant material is substantially transparent and of a thickness between about 14,000 Angstroms and 40,000 Angstroms, to prevent undesirable discoloration of the metal-coated surface of the article due to optical interference effects that would otherwise be produced by incident light rays, and to allow adhesion to the article.

12. The method of claim 11 wherein said metallic primer material is a material selected from the group consisting of titanium, chromium, nickel and a Nichrome alloy.

13. The method of claim 11 wherein;
said metallic article is composed of a base metal, the different metal with which it is coated comprises a precious metal, and the protective film is a glass, where the glass that can be used as a protective film is a mixture of oxides selected from the group consisting of $SiO_2$, $Na_2O$, $CaO$, $MgO$, $Al_2O_3$, $K_2O$, $B_2O_3$, $Li_2O$, and $PbO$, and has a refractive index in the range of from about 1.4 to about 2.8 and the sputtering apparatus is sequentially operated in said three modes for predetermined periods of time such that the thickness of the precious metal coating is less than 100,000 Angstroms, and the thickness of the primer-metal coating is from about 50 Angstroms to 400 Angstroms.

14. The method of claim 13 wherein;
said base metal comprises stainless steel,
said primer-metal coating is composed of titanium and has a thickness of about 200 Angstroms, and
the precious metal coating comprises a layer of sputtered gold or a gold alloy that has a thickness in the range of from about 2,500 to 5,000 Angstroms.

15. In the manufacture of a metallic article of merchandise that is subjected to frequent human contact during normal usage of the article and is thus exposed to abrasion and/or corrosion damage by such usage and contact, the method of protecting the surface of said metallic article from such abrasion and/or corrosion damage during use without materially altering the color or appearance of said surface, which method comprises;

placing the metallic article in the deposition chamber of a sputtering apparatus along with (a) a first target composed of a selected non-metallic inert material which has a thermal expansion coefficient smaller than that of the metallic article, is selected from the group consisting of $SiO_2$, $SiC$, $Si_3N_4$, $TiO_2$, $MgO$, $Al_2O_3$, $Ta_2O_5$, $Nb_2O_5$, $GeO$, spinel and glasses that have a Knoop hardness of at least about 400 and consist essentially of mixed oxides, and is adapted to form a sputter-deposited protective film of controlled thickness that is abrasion-resistant and substantially colorless and transparent and (b) a second target composed of another selected non-metallic inert material that has a thermal expansion coefficient greater than that of the protective film material and less than that of the metallic article and is also adapted to form a sputter-deposited layer that is substantially colorless and transparent, evacuating said chamber and, after introducing a sputtering gas therein, operating the sputtering apparatus in a first mode such that a sputtered layer of material from the second target is deposited on the metallic article and thereby provides a buffer layer which is substantially colorless and transparent and reduces thermally-induced stresses caused by the difference in the thermal expansion coefficients of the metallic article and the protective film material, and while the metallic article is still in the gas-filled coating chamber, operating the sputtering apparatus in a second mode such that a sputtered protective film of material from the first target is deposited over the said buffer layer, the operation of the sputtering apparatus being of such duration that the combination of the deposited buffer layer plus protective film of abrasion-resistant material is substantially transparent and of a thickness between about 14,000 Angstroms and 40,000 Angstroms, to prevent undesirable discoloration effects due to optical interference produced by incident light rays, to provide the desired protection against abrasion and/or corrosion damage when the metallic article is in use, and to allow both to adhere to the article.

16. The method of claim 15 wherein said metallic article is plated with a precious metal coating prior to the sequential sputter-deposition operations, the glass that can be used as the protective film is a mixture of oxides selected from the group consisting of $SiO_2$, $Na_2O$, CaO, MgO, $Al_2O_3$, $K_2O$, $B_2O_3$, $Li_2O$, and PbO, and has a refractive index in the range of from about 1.4 to about 2.8, and where the protective film is a glass, the second target material, providing the buffer layer is a material selected from the group consisting of SiC, $Si_3N_4$, $TiO_2$, MgO, $Al_2O_3$, $Ta_2O_5$, $Nb_2O_5$, GeO, spinel and glasses that have a Knoop hardness over about 400 and are a mixture of oxides selected from the group consisting of $SiO_2$, $Na_2O$, CaO, MgO, $Al_2O_3$, $K_2O$, $B_2O_3$, $Li_2O$, and PbO, and have a refractive index in the range of from about 1.4 to about 2.8.

17. The method of claim 15 wherein said buffer layer is composed of a glass-like material.

18. In the manufacture of a metallic article of merchandize that is subjected to abrasion damage during normal use which progressively degrades the aesthetic appearance and quality of the article, the method of coating said metallic article with a composite coating which automatically restores the aesthetic appearance of the article during the course of such use and resulting abrasion and consists essentially of a plurality of overlapping alternately-arranged thin films of (a) a metal that enhances the aesthetic appearance of the metallic article and (b) a selected non-metallic material which is substantially transparent in thin-film form and is also of sufficient hardness to constitute an abrasion-resistant material, said films being of such thickness that they are adapted to be worn away sequentially by abrasion during normal usage of the article, which method comprises;

placing the metallic article in the coating chamber of a sputtering apparatus along with a quantity of the metal to be deposited on the article and a quantity of said non-metallic abrasion-resistant material selected from the group consisting of $SiO_2$, SiC, $Si_3N_4$, $TiO_2$, MgO, $Al_2O_3$, $Ta_2O_5$, $Nb_2O_5$, GeO, spinel and glasses that have a Knoop hardness over about 400 and consist essentially of mixed oxides, evacuating said coating chamber and, after introducing a sputtering gas therein, sequentially operating the sputtering apparatus in first and second modes for predetermined times such that a thin film of sputtered metal of predetermined thickness is first deposited on said article and then coated with a thin film of sputtered non-metallic abrasion-resistant material which is also of predetermined thickness, the operation of the sputtering apparatus in said second mode being of such duration that the film of sputtered non-metallic abrasion-resistant material is not only substantially transparent but is also substantially colorless and thus protects the underlying film of sputtered metal without substantially altering the aesthetic appearance of the sputtered metal film, and then repeating the sequential operation of said sputtering apparatus in said first and second modes for said predetermined times until a predetermined number of overlapping alternately-arranged thin films of sputtered metal and adherent, substantially colorless and transparent protective thin films of sputtered non-metallic abrasion-resistant material are deposited on the metallic article and thus form said composite coating.

19. The method of claim 18 wherein the sequential operation of the sputtering apparatus is repeated up to twenty times so that a total of from 4 to 40 overlapping and alternately-arranged films of sputtered metal and sputtered non-metallic abrasion-resistant material are deposited on the metallic article.

20. The method of claim 18 wherein the operation of the sputtering apparatus in said first and second modes is so correlated with the sputtering yields of the metal to be deposited and the said non-metallic abrasion-resistant material that the thickness of each of the sputter-deposited thin films is less than about 100 Angstroms.

21. The method of claim 18 wherein; the abrasion resistant material is a glass,
said metal to be deposited comprises a precious metal and the glass that can be used as the abrasion resistant material is a mixture of oxides selected from the group consisting of $SiO_2$, $Na_2O$, CaO, MgO, $Al_2O_3$, $K_2O$, $B_2O_3$, $Li_2O$, and PbO, and has a refractive index in the range of from about 1.4 to about 2.8.

22. The method of claim 18 wherein the operation of the sputtering apparatus in said first and second modes is so correlated with the sputtering yields of the precious metal and the said non-metallic abrasion-resistant material that each of the sputter-deposited thin films of precious metal is of substantially uniform thickness and each of the sputter-deposited thin films of said non-metallic abrasion-resistant material is also of substantially uniform thickness and thicker than the respective precious metal films.

23. The method of claim 22 wherein the sputtering yield-duration correlation is such that thickness of each of the precious metal films does not exceed about 50 Angstroms and the thickness of each of the non-metallic abrasion-resistant films does not exceed about 100 Angstroms.

24. The method of claim 23 wherein;
the precious metal is platinum, silver, gold or a gold alloy, and
the metallic article is composed of a base metal that is coated with a primer material which promotes the adhesion of the first sputter-deposited film of precious metal.

* * * * *